United States Patent [19]

Wong

[11] Patent Number: 5,424,663
[45] Date of Patent: Jun. 13, 1995

[54] INTEGRATED HIGH VOLTAGE DIFFERENTIAL SENSOR USING THE INVERSE GAIN OF HIGH VOLTAGE TRANSISTORS

[75] Inventor: Stephen L. Wong, Scarsdale, N.Y.

[73] Assignee: North American Philips Corporation, New York, N.Y.

[21] Appl. No.: 51,141

[22] Filed: Apr. 22, 1993

[51] Int. Cl.⁶ .............................................. H03K 5/24
[52] U.S. Cl. ...................................... 327/65; 327/69; 327/561
[58] Field of Search ............... 307/540, 548, 358, 354, 307/494, 490, 574, 350; 330/253, 254; 327/65, 69, 309, 312, 82, 561

[56] References Cited

U.S. PATENT DOCUMENTS

| | | | |
|---|---|---|---|
| 4,388,540 | 6/1983 | Schreurs | 307/494 |
| 4,625,131 | 11/1986 | Kasperkovitz et al. | 307/540 |
| 5,081,708 | 1/1992 | Saochi et al. | 307/358 |
| 5,113,092 | 5/1992 | Herold | 307/356 |
| 5,189,317 | 2/1993 | Palara et al. | 307/358 |
| 5,220,207 | 6/1993 | Kovalcik et al. | 307/350 |

FOREIGN PATENT DOCUMENTS 0292270 11/1988 European Pat. Off. .
0492311 7/1992 European Pat. Off. .
56-153416 11/1981 Japan .
61-97577 5/1986 Japan .

Primary Examiner—Timothy P. Callahan
Assistant Examiner—My Trang Nu Ton
Attorney, Agent, or Firm—Bernard Franzblau

[57] ABSTRACT

An integrated high voltage differential sensor which uses the inverse gain of a pair of parasitic JFETs to provide a low power circuit for translating a differential high voltage signal down to a lower voltage level that can be easily sensed by the low voltage control circuitry in a power IC and without the use of a resistive voltage divider. The IC includes, between a first high voltage input and ground, a first series circuit of a first JFET, a first voltage level shifting resistor and a bias current source ($I_B$). A second series circuit of a reference resistor ($R_L$), a second JFET, a second voltage level shifting resistor and a bias current source ($I_B$) is coupled between a second high voltage input and ground. A feedback circuit including an operational amplifier is coupled between a low voltage point of the first series circuit and the gates of both JFETs so as to adjust the bias voltages of the JFETs. A comparator is coupled to a low voltage point of the second series circuit and switches about an input differential threshold value of $I_B R_L$.

26 Claims, 1 Drawing Sheet

INTEGRATED HIGH VOLTAGE DIFFERENTIAL SENSOR USING THE INVERSE GAIN OF HIGH VOLTAGE TRANSISTORS

BACKGROUND OF THE INVENTION

This invention relates to a circuit for sensing a differential high voltage and more particularly to a power integrated circuit for sensing differential high voltage signals.

A common problem that exists in the field of integrated circuit technology is that of sensing or monitoring high voltage signals, especially differential high voltage signals, in view of the limited power handling capability of the integrated circuit (IC) chip. It is conventional to use a resistive voltage divider to translate the high voltage signals down to a lower level at which they can be conveniently processed by an IC voltage sensor or monitor circuit. However, the use of a resistive voltage divider entails several disadvantages which make this solution unattractive in many technological applications. For example, a resistive voltage divider results in a considerable waste of power. This power increases with the square of the voltage, thus making the overall circuit in which it is used less efficient. The resistive voltage divider also uses a considerable area of the integrated circuit chip and thereby increases the size of the IC chip, especially in the case where it is desired to sense or monitor a high differential voltage, for example, in the range of a few hundred volts. In this case, two resistive voltage dividers would be needed, making it impractical to use in an integrated circuit environment.

SUMMARY OF THE INVENTION

It is therefore an object of the present invention to provide a low power control circuit that functions as a high voltage differential sensor.

Another object of the invention is to provide a high voltage differential sensor which avoids the use of a resistive voltage divider.

A further object of the invention is to provide a high voltage differential sensor that can be implemented as an integrated circuit.

Another object of the invention is to provide a high voltage differential voltage sensor that is more efficient with respect to power consumption and chip area.

A still further object of the invention is to provide a low power integrated circuit for sensing a high differential voltage by means of a circuit that requires relatively few circuit components.

According to one aspect of the invention, means are provided for attenuating the differential high voltage signals to a relatively low voltage level at which the voltage signals can be monitored using a low voltage control circuit, and without the use of a resistive voltage divider as the attenuation device. In a preferred embodiment of the invention, the attenuating means comprise high voltage JFETs, and the control circuit comprises a low voltage comparator.

A major advantage of the invention is that the JFETs and the control circuit are easily integrated into a common substrate to form a high voltage integrated circuit. A further advantage is that the circuit occupies less area of the integrated circuit than in the case where a resistive voltage divider is used. A third advantage is that the bias current in the JFET is independent of the input voltage, unlike the case of the resistive divider, where the current increases linearly with the voltage. The result is that this invention consumes considerably less power as compared to the use of a resistive voltage divider since power loss in the latter case is a function of the square of the input voltage ($V^2/R$). In contrast, in the circuit of the present invention the power loss is a function of the first power of the input voltage ($P = VI_B$).

In a further preferred embodiment of the invention, first and second high voltage JFETs are connected in series between, respectively, first and second high voltage inputs and a current source. The current source fixes the bias currents in each JFET. The JFETs attenuate a high differential voltage applied to the first and second inputs. On the low voltage side of the JFETs are connected level shifting means, for example, in the form of first and second equal value resistors in series with the first and second JFETs, respectively. An operational amplifier has its negative input connected to the series resistor of the first JFET, and a comparator circuit has one input connected to the series resistor of the second JFET. Both operational amplifier and comparator have their second input connected to a source of reference voltage, V ref. The operational amplifier output is fed back and is connected to the gates of both JFETs. The level shifting devices are selected to force the JFET source electrodes to a high enough voltage value such that the gate bias of the JFETs will fall within the output voltage swing of the operational amplifier. This manner of biasing the JFETs, i.e., using an op amp feedback loop, will make it possible to reject any common mode signals in the circuit.

BRIEF DESCRIPTION OF THE DRAWINGS

The invention will now be described in greater detail with reference to the accompanying drawing, the sole FIGURE of which shows a low power integrated circuit for sensing a high differential voltage.

DESCRIPTION OF THE PREFERRED EMBODIMENTS

Figure 1:
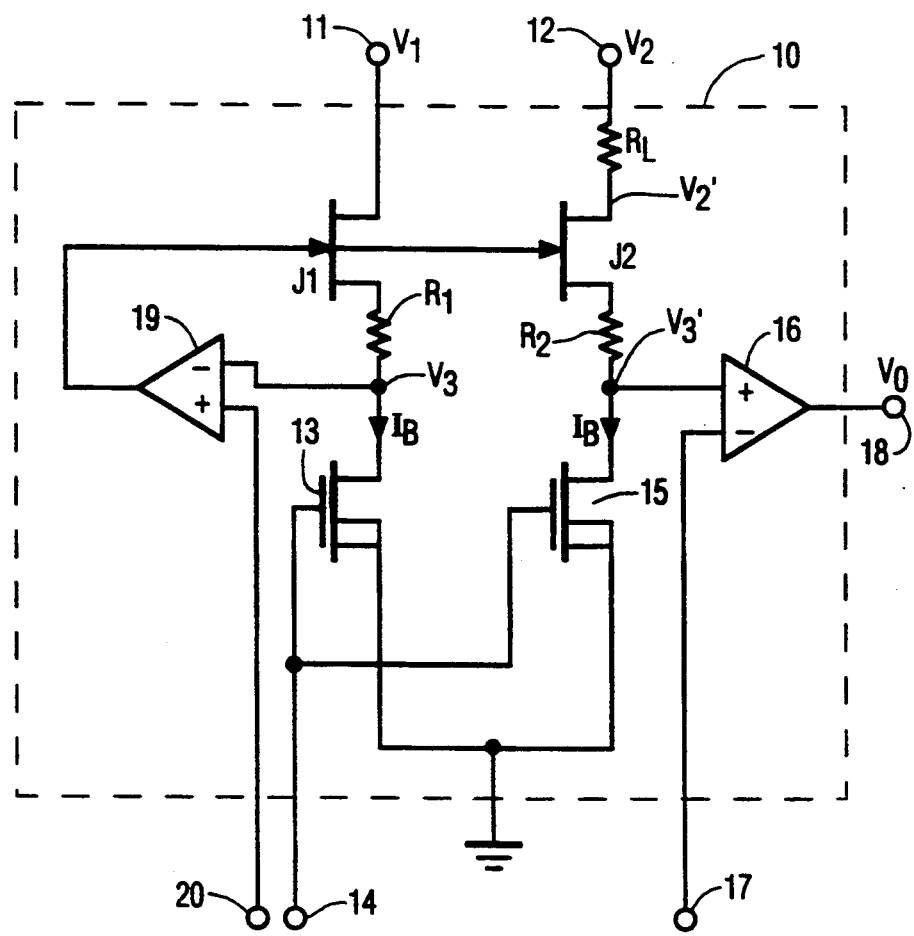

The sole FIGURE of the drawing shows an integrated circuit 10, illustrated diagrammatically by means of dashed lines, and which incorporates a low power circuit for sensing and/or monitoring a high differential voltage applied to signal voltage input terminals 11 and 12 as voltages V1 and V2, respectively. The signal voltage input terminal 11 is directly connected to the drain electrode of a first JFET labelled J1. The second voltage input terminal 12 is connected to the drain electrode of a second JFET, labelled J2, via a load resistor $R_L$.

The first and second JFETs are preferably so-called parasitic JFETs, that is they are called parasitic because they are formed in the integrated circuit 10 using only selected layers from a known power IC process. The layers have not been optimized and so the resulting JFET will not have a very high performance. Since each JFET operates as an attenuator, rather than as an amplifier, it is desirable that the gain of each JFET be relatively low.

The source electrode of the first JFET J1 is connected to a current source 13 supplying a bias current $I_B$ via a resistor R1 that functions as an element for shifting the voltage level. The current source 13 is shown as a field effect transistor connected between the voltage level shift resistor R1 and ground and with its gate electrode connected directly to a gate bias voltage terminal 14 which supplies a fixed DC voltage to the gate of FET 13. Of course, other suitable forms of current source could be substituted for that shown in the drawing.

Similarly, the source electrode of the second parasitic JFET J2 is connected to a current source 15 via a corresponding voltage level shifting resistor R2. The resistors R1 and R2 preferably have the same resistance value, a suitable value being 35K ohms. The current source 15 is similar to the current source 13 and consists of a field effect transistor connected between the resistor R2 and ground and with its gate electrode connected in common with the gate of FET 13 to the gate bias voltage input 14.

A comparator circuit 16 has a non-inverting input (+) connected to a junction point between the resistor R2 and the drain of field effect transistor 15 and has an inverting input (−) connected to a terminal 17 which supplies a reference voltage ($V_{ref}$) to the comparator. The output terminal of the comparator is connected to the integrated circuit output terminal 18 at which an output voltage $V_0$ is produced, as will be described below.

An operational amplifier 19 has an inverting input (−) connected to the junction of resistor R1 and the drain electrode of current source FET 13. The non-inverting (+) input of the operational amplifier is connected to a terminal 20 which supplies a reference voltage to the non-inverting input of the operational amplifier. As an alternative, it is noted that the circuit will also operate as desired if the negative input of the comparator circuit is connected to the negative input of the operational amplifier instead of to the reference voltage, $V_{ref}$.

The output of the operational amplifier is connected to the gate electrodes of each of the JFETs J1 and J2. The operational amplifier thereby provides a feedback loop so as to bias the gate electrodes of both JFETs.

In operation, two high voltage sources, V1 and V2, are connected to terminals 11 and 12 as shown in the drawing. As a result, a current $I_B$ is caused to flow via the current source 13 through the resistor R1 and the source-drain circuit of the JFET J1, and a current $I_B$ also flows through resistor R2, the JFET J2 and the load resistor $R_L$. The resistance values of resistors R1 and R2 are chosen such that when the voltage $V_2'$ at the drain of JFET J2 and the voltage $V_1$ are equal, the voltage $V_3'$ at the junction of resistor R2 and FET 15 equals the negative input voltage of the op-amp 19. Under closed loop conditions this equals V ref. This is the case when R1=R2 because both JFETs have exactly the same bias current and bias voltages. The result is that the comparator circuit output voltage $V_0$ is zero. When $V_2'=V_1$, $V_2=V_2'+I_BR_L$, also sets the condition at which the comparator circuit output equals zero. Under this condition, $V_2-V_1=I_BR_L$ defines the differential threshold voltage between the voltages $V_2$ and $V_1$ which causes the comparator to change state.

In order to maintain the system in balance whereby common mode signals can be rejected, it is advantageous to provide suitable biasing of the JFETs. This is obtained by maintaining sufficient bias current $I_B$ flowing to the JFET source electrodes. As mentioned above, the purpose of resistors R1 and R2 is to serve as level shifting devices which force the source electrodes of both JFETs to a high enough voltage value so that the gate bias voltage of the JFETs will fall within the output voltage swing of the operational amplifier. The operational amplifier provides a feedback loop in order to bias the JFET gates in response to the JFET source-drain current.

Assuming the voltage $V_1$ remains constant, and, as mentioned, the voltage $V_2$ has a value such that $V_1=V_2'$, the comparator circuit output remains substantially at zero. Under these conditions, $V_2-V_1=I_BR_L$ and $V_3'=V_3=V_{ref}$ (assuming R1=R2) because both of the JFETs have exactly the same bias current and bias voltage.

However, when $V_2$ changes such that $V_2-V_1>I_BR_L$ and thus $V_3'>V_{ref}$, then the comparator output voltage $V_0$ goes high. For the reverse condition, i.e., $V_2-V_1<I_BR_L$ and $V_3'<V_{ref}$, the output voltage $V_0$ goes low. In all three cases, the voltage at the negative input of the operational amplifier remains substantially the same, but the voltage changes at the positive input of the comparator cause the output voltages to change, as indicated.

Although in principle any high voltage transistor (for example, an LDMOS) can be used in place of the JFETs, in practice the latter are preferred. The reason for this is that the invention makes use of the readily available parasitic JFET as an attenuator, and it is desirable that the gain of the JFET be low. If the gain of the JFET were too well optimized, it could result in an attenuation factor that may be too low for the purposes of the invention.

It thus can be seen that the integrated high voltage differential sensor of the invention is quite simple. It makes use of only two high voltage JFETs (so-called parasitic JFETs), two low voltage current sources, one low voltage operational amplifier, one low voltage comparator, and three resistors. The circuit can process high voltages, e.g. 50 V–700 V by means of the low voltage circuits operating in the range of 5 V–16 V. Since the voltage drop $I_BR_L$ provides the operating threshold for the circuit, the circuit threshold can be changed by changing either $I_B$ or $R_L$. Resistors R1 and R2 shift the voltage level for the source electrodes of the JFETs. Either $V_1$ or $V_2$ or both $V_1$ and $V_2$ can be a high voltage. Depending on the threshold of the JFET devices, the resistors R1 and R2 may be omitted or may be replaced by some other level shifting devices, such as diodes.

Although the invention has been described in connection with a preferred embodiment thereof, it will be apparent to those skilled in the art that various changes and modifications can be made without departing from the true spirit and scope of the invention as defined in the appended claims.

What is claimed is:

1. A circuit for sensing when a voltage differential present between first and second high voltage inputs diverges from a given voltage threshold level, said circuit comprising:
   means coupled to the first and second high voltage inputs for actively attenuating the first and second high voltages into corresponding first and second low voltages, and
   comparator means having an input coupled to said attenuating means and responsive to at least one of the low voltages for indicating when the voltage differential diverges from the given voltage threshold.

2. A voltage sensing circuit as claimed in claim 1 wherein the attenuating means comprises first and second JFETs connected between said first and second high voltage inputs, respectively, and a current source that determines the given voltage threshold level.

3. A voltage sensing circuit as claimed in claim 1 wherein the active attenuating means comprise at least first and second high voltage JFETs coupled to said first and second high voltage inputs, respectively, said circuit further comprising an operational amplifier having an input coupled to said attenuating means and responsive to an other one of said low voltages and having an output connected to bias respective gate electrodes of the first and second JFETs so that the comparator means will not respond to common mode signals at said high voltage inputs.

4. A voltage sensing circuit as claimed in claim 1 wherein the attenuating means comprise first and second high voltage field effect transistors connected in series between the first and second high voltage inputs, respectively, and a current source means, and means connecting an input of an operational amplifier to the current source means and an output of the operational amplifier in common to gates of the first and second field effect transistors.

5. An integrated circuit for sensing when a voltage differential between first and second high voltage inputs differs from a given voltage threshold level, said circuit comprising:
first and second high voltage inputs, and
a semiconductor substrate including:
at least one current source,
first and second high voltage field effect transistors adapted to attenuate a voltage applied thereto,
first means for coupling the first field effect transistor and the one current source in a first series circuit to said first input,
second means for coupling the second field effect transistor and the one current source in a second series circuit to said second input, and
a comparator circuit having an input coupled to a low voltage node in the second series circuit and responsive to a low voltage therein derived by attenuation of the high voltage of the second high voltage input by the second field effect transistor, said comparator circuit producing an output signal indicating when the voltage differential differs from the given voltage threshold level.

6. A voltage sensing circuit as claimed in claim 5 further comprising:
an impedance element connected in the second series circuit such that the given voltage threshold level is determined by a voltage drop across the impedance element produced by a current $I_B$ from the one current source.

7. An integrated voltage sensing circuit as claimed in claim 6 further comprising a feedback circuit including an operational amplifier having an input coupled to a low voltage node in the first series circuit and responsive to a low voltage therein derived by attenuation of the high voltage of the first input by the first field effect transistor, said operational amplifier having an output coupled to control electrodes of the first and second field effect transistors so as to bias the field effect transistors at a predetermined level.

8. A voltage sensing circuit as claimed in claim 7 further comprising:
means for coupling a second input of the comparator circuit and a second input of the operational amplifier to at least one further source of reference voltage.

9. A voltage sensing circuit as claimed in claim 5 further comprising:
first and second equal impedance elements connected in the first and second series circuits, respectively, and wherein
said at least one current source comprises first and second field effect transistors connected in said first and second series circuits, respectively, and with their control electrodes connected in common to a source of reference voltage.

10. A voltage sensing circuit as claimed in claim 9 further comprising;
a feedback circuit including an operational amplifier having an input coupled to a low voltage node in the first series circuit and responsive to a low voltage therein derived by attenuation of the high voltage of the first input by the first field effect transistor, said operational amplifier having an output coupled to control electrodes of the first and second field effect transistors so as to bias the field effect transistors at a predetermined level, and
means for coupling a second input of the comparator circuit and a second input of the operational amplifier to at least one further source of reference voltage.

11. A voltage sensing circuit as claimed in claim 5 further comprising a feedback circuit including an operational amplifier having an input coupled to a low voltage node in the first series circuit and responsive to a low voltage therein derived by attenuation of the high voltage of the first high voltage input by the first field effect transistor, said operational amplifier having an output coupled to control electrodes of the first and second field effect transistors so as to bias the field effect transistors at a predetermined level.

12. A voltage sensing circuit as claimed in claim 11 wherein said first and second field effect transistors comprise first and second JFET's, respectively, said circuit further comprising:
first and second equal impedance elements connected in the first and second series circuits, respectively,
said first series circuit comprising the first JFET, the first impedance element and the at least one current source, in the order named, coupled between the first high voltage input and a point of reference voltage,
said second series circuit comprising the second JFET, the second impedance element and the at least one current source, in the order named, coupled between the second high voltage input and said point of reference voltage, and wherein
the input of the comparator circuit is coupled to a first junction point between the second impedance element and the one current source, and
the input of the operational amplifier is coupled to a second junction point between the first impedance element and the one current source.

13. A voltage sensing circuit as claimed in claim 11 wherein the comparator circuit and the operational amplifier each have a second input coupled to a source of reference voltage.

14. An integrated circuit for sensing when a voltage differential between first and second high voltage inputs exceeds a given voltage threshold level, said circuit comprising:
a semiconductor substrate, first means integrated into the substrate for attenuating said first high voltage input into a first low voltage output, second means integrated into the substrate for attenuating said second high voltage into a second low voltage output, and comparator means having at least one input coupled to one of said low voltage outputs and an output for indicating when the voltage differential differs from the given voltage threshold.

15. The voltage sensing circuit as claimed in claim 14 further comprising:

a feedback circuit having at least one input coupled to one of said low voltage outputs and an output coupled to biasing electrodes of said attenuating means so as to adjust bias voltages to a level so as to prevent the comparator means from being responsive to high voltage common mode signals appearing at said high voltage inputs.

16. A voltage sensing circuit as claimed in claim 15 wherein said attenuating means comprises a high voltage field effect transistor having a drain, a gate, and a source electrode, and wherein said drain electrode is coupled to said high voltage input, said gate electrode operates as a biasing electrode, and said source electrode is coupled to said low voltage output and to a current source.

17. A voltage sensing circuit as claimed in claim 16 wherein said field effect transistor comprises a lateral DMOS transistor.

18. A voltage sensing circuit as claimed in claim 16 wherein said field effect transistor comprises a JFET.

19. The voltage sensing circuit as claimed in claim 18 further comprising a voltage level shifting resistor connected in series to the source electrode of the JFET.

20. A voltage sensing circuit as claimed in claim 16 wherein said current source comprises a field effect transistor with its gate electrode connected to a source of reference voltage.

21. A voltage sensing circuit as claimed in claim 15 wherein said feedback circuit comprises an operational amplifier having a negative input coupled to at least one of said low voltage outputs, a positive input coupled to a reference voltage source, and an output coupled to said biasing electrodes.

22. A voltage sensing circuit as claimed in claim 14 wherein said comparator means comprises a comparator having one input coupled to one of said low voltage outputs and a second input coupled to a source of reference voltage.

23. A voltage sensing circuit as claimed in claim 14 wherein said comparator means comprises a comparator having negative and positive inputs coupled to respective low voltage outputs of said first and second attenuating circuits.

24. The voltage sensing circuit as claimed in claim 14 further comprising, means coupled to at least one of said attenuating means for setting said given voltage threshold level to a desired value, and an output terminal connected to said output of the comparator means thereby to provide a circuit output signal for indicating when the voltage differential differs from the given voltage threshold.

25. The voltage sensing circuit as claimed in claim 14 further comprising means coupled to at least one of said attenuating means for adjusting said given voltage threshold level to a desired value.

26. A voltage sensing circuit as claimed in claim 25 wherein said means for adjusting the voltage threshold level comprises an impedance element connected in series to one of said high voltage inputs whereby the given voltage threshold level is determined by a voltage drop across said impedance element.

* * * * *